United States Patent
Piorra et al.

(10) Patent No.: US 9,841,472 B2
(45) Date of Patent: Dec. 12, 2017

(54) MAGNETOELECTRIC SENSOR AND METHOD FOR THE PRODUCTION THEREOF

(71) Applicant: Christian-Albrechts-Universitaet zu Kiel, Kiel (DE)

(72) Inventors: Andre Piorra, Kiel (DE); Eckhard Quandt, Heikendorf (DE)

(73) Assignee: Christian-Albrechts-Universitaet zu Kiel, Kiel (DE)

( * ) Notice: Subject to any disclaimer, the term of this patent is extended or adjusted under 35 U.S.C. 154(b) by 79 days.

(21) Appl. No.: 14/427,714

(22) PCT Filed: Oct. 7, 2013

(86) PCT No.: PCT/EP2013/070817
§ 371 (c)(1),
(2) Date: Mar. 12, 2015

(87) PCT Pub. No.: WO2014/056842
PCT Pub. Date: Apr. 17, 2014

(65) Prior Publication Data
US 2015/0247904 A1    Sep. 3, 2015

(30) Foreign Application Priority Data
Oct. 8, 2012   (EP) ..................... 12187606

(51) Int. Cl.
*G01R 19/00* (2006.01)
*G01R 33/09* (2006.01)
(Continued)

(52) U.S. Cl.
CPC .............. *G01R 33/09* (2013.01); *H01L 41/00* (2013.01); *H01L 41/047* (2013.01)

(58) Field of Classification Search
CPC ................ G01R 33/441; G01R 33/326; G01R 33/34023; G01N 24/08; G01N 24/84; G01N 24/10
See application file for complete search history.

(56) References Cited

U.S. PATENT DOCUMENTS 6,496,333 B1 * 12/2002 Han ..................... G11B 5/3903
                                                                    360/315
6,627,932 B1 *  9/2003 Drewes ................. H01L 27/222
                                                                    257/295
(Continued)

FOREIGN PATENT DOCUMENTS

EP    2538235 A1   12/2012
JP    11126449 A    5/1999

OTHER PUBLICATIONS

International Search Report dated Dec. 5, 2013 in International Application No. PCT/EP2013/070817.

*Primary Examiner* — Tung X Nguyen
*Assistant Examiner* — Dominic Hawkins
(74) *Attorney, Agent, or Firm* — Patent Central LLC; Stephan A. Pendorf

(57) ABSTRACT

Magnetoelectric sensors that can be manufactured using known methods of thin film technology and output an ME voltage that is many times higher for a predetermined magnetic field than the known cantilever-beam sensor. The design that is termed separator ME sensor is characterized by the arrangement of a thick dielectric layer (14) between the ferroelectric (10) and the magnetostrictive phases (12), and by an electrode arrangement (18) applied on one side of the ferroelectric (10) and that is engineered to tap the ME voltage along the extent of the layer. Advantageously, it can be manufactured easily by coating conventional dielectric substrates (14) on the front and rear with one each of the functional layers (10, 12).

8 Claims, 3 Drawing Sheets

(51) Int. Cl.
*H01L 41/00* (2013.01)
*H01L 41/047* (2006.01)

(56) References Cited

U.S. PATENT DOCUMENTS

| | | | | |
|---|---|---|---|---|
| 6,790,676 | B2* | 9/2004 | Cerva | H01L 21/31691 |
| | | | | 257/295 |
| 6,835,463 | B2* | 12/2004 | Srinivasan | H01F 1/344 |
| | | | | 310/311 |
| 7,038,358 | B2* | 5/2006 | Bryant | H01L 41/047 |
| | | | | 310/344 |
| 7,138,064 | B2* | 11/2006 | Honda | H01L 21/4857 |
| | | | | 216/102 |
| 2001/0028245 | A1* | 10/2001 | Li | G01R 33/02 |
| | | | | 324/312 |
| 2001/0040450 | A1* | 11/2001 | Li | G01R 33/02 |
| | | | | 324/260 |
| 2003/0156362 | A1* | 8/2003 | Gill | B82Y 10/00 |
| | | | | 360/324.12 |
| 2005/0084984 | A1* | 4/2005 | Zhuang | H01L 27/11502 |
| | | | | 438/3 |
| 2007/0252593 | A1 | 11/2007 | Takeuchi et al. | |
| 2008/0145693 | A1 | 6/2008 | Zou et al. | |
| 2008/0193780 | A1 | 8/2008 | Viehland et al. | |
| 2009/0067224 | A1* | 3/2009 | Hochstrat | G11C 11/16 |
| | | | | 365/158 |
| 2011/0077663 | A1 | 3/2011 | Sundaresan et al. | |

\* cited by examiner

MAGNETOELECTRIC SENSOR AND METHOD FOR THE PRODUCTION THEREOF

The invention relates to a magnetoelectric—short: ME—sensor for measuring magnetic fields comprising a layer stack from a magnetostrictive layer, a ferroelectric layer, and an electrically non-conducting—below: dielectric—support layer.

For a couple of years, magnetoelectric composites have been a focus in the research area of sensorics with the aim of measuring very small, usually time-dependent magnetic fields. Magnetoelectric composites consist of a magnetostrictive and a piezoelectric phase. Ferroelectrics also are among the piezoelectric materials.

A magnetic field H effects a change in length of the magnetostrictive phase that is transferred by means of mechanical coupling onto the piezoelectric and generates there a mechanical tensile or shear stress. In the piezoelectric material, the piezoelectric voltage constant g produces a dielectric polarisation that results macroscopically in a magnetoelectric voltage $U_{ME}$ that can be measured. Here, the achievable electric voltage $U_{ME}$ (below also ME voltage) is directly proportional to the piezomagnetic coefficient $d^m$, the piezoelectric voltage constant g, the coupling of the two phases k and the layer thickness z of the piezoelectric material (equation 1).

$$\frac{\Delta U_{ME}}{\Delta H} \propto d^m * k * g * z \quad (1)$$

A magnetoelectric composite is usually engineered like a simple plate capacitor. Here the piezoelectric material—e.g. aluminium nitride, AlN, lead zirconate titanate, PZT—as dielectric is arranged between to electrically conducting layers that act as electrodes. The magnetostrictive phase is usually designed as at least one of the electrodes if a metallic, magnetostrictive material is to be used anyway. The advantage of metallic materials is the size of the magnetostrictive effect. the highest piezomagnetic coefficients can be observed with metallic, amorphous materials such as Metglas® (FeCoSiB).

It is further known to engineer magnetoelectric composites as thin film composites that usually exhibit supports for the functional layers as further components. It is advantageous to use such composites for small required dimensions and for producing sensor arrays. A further advantage can be seen here in that adhesive technology can be dispensed with, the otherwise conventional bonding technology for compact materials. With the adhesive layer, a layer is omitted at the interface between the phases that could partly absorb the magnetostrictive change in length. Among others, this also improves the reproducibility of thin film ME sensors.

Thin film ME sensors are often designed as cantilever beams that are clamped on one side. It is observed here that cantilever beams operated in resonance with high figure of merit exhibit very high magnetoelectric voltages. (H. Greve, E. Woltermann, H.-J. Quenzer, B. Wagner, and E. Quandt, "Giant magnetoelectric coefficients in (Fe90Co10) 78Si12B10-AlN thin film composites", Applied Physics Letters, vol. 96, 2010, p. 182501).

In FIG. 1, an ME cantilever-beam sensor according to the prior art is outlined. On a substrate strip (14) that is immobilised on one side, at first a lower electrode (16), on this a piezoelectric layer (10), and again on this a metallic magnetostrictive layer (12) are arranged. The ME voltage $U_{ME}$ is tapped, as illustrated, between the lower electrode (16) and the magnetostrictive layer (12).

Cantilever-beam sensors according to FIG. 1 are manufactured using methods of microsystems technology. Typical substrates (14) are silicon wafers on which the single layers are deposited using known methods like cathode sputtering or physical vapour deposition, PVD, or a sol gel method. The coated wafers are usually patterned lithographically, this then being followed by dicing the actual cantilever beams.

In the case of thin film ME sensors, the substrate (14) forms an integral part of the layer stack mentioned in the preamble, since on account of their small thickness, the functional layers (ferroelectric, magnetostrictive) (10, 12) cannot be cantilevered. The support layer mentioned in the preamble can be identified with the substrate (14).

As has already been explained, the ratio of the measurable ME voltage to the exciting magnetic field strength is proportional to the layer thickness of the piezoelectric or, say, the distance of the electrodes across the piezoelectric phase. Therefore, the ME voltage arising from a predetermined magnetic field strength can be increased by increasing the layer thickness of the piezoelectric.

With reference to thin film ME sensors, such strategy is limited when using the conventional methods of microsystems technology. Among others, limitations result from the residual stresses and the low deposition rate.

An alternative can be gathered from the specification US 2008/0193780 A1. An ME sensor constructed as layer stack is proposed whose core is formed by an arrangement of parallel extending ferroelectric fibres—in this case e.g. from lead zirconate titanate, PZT—in a matrix epoxide. On both flat sides of the layer-shaped ferroelectric composite thus formed, one interdigital electrode—short: IDT—a thin polymer film as electric insulator—see there FIGS. 2, 28A and 28B and paragraph 0057 "insulating field"—, and a metallic magnetostrictive layer (Metglas®) are in each case arranged. Here the electrodes are arranged such that electrode fingers having the same polarity are made to lie directly one on top of the other. By means of poling, the polarisation vector of the ferroelectric composite can be oriented in a spatially alternating manner along the fibre direction—longitudinal—between the neighbouring electrode fingers of opposite polarity. The specification mentions "push-pull units" and refers to the magnified detail 200 of the relevant FIG. 2.

In principle, signal tapping via the IDT makes it possible to establish, by choosing the finger distance of the electrodes, how large the ME voltage is going to be for a predetermined magnetic field. The principle holds: the larger the finger distance, the larger the ME voltage.

To avoid misunderstandings, it is to be clarified here and below that the finger distance of an electrode arrangement specifies the smallest distance of two not mutually contacted electrodes or, as an alternative, the length of that path across which the largest electric field strength is present when a predetermined voltage is applied to the electrodes. In particular in terms of interdigital electrodes, the interdigitating fingers of the electrodes and consequently the finger distance that is uniformly present everywhere, are terms known to the person skilled in the art.

The ME sensor according to US 2008/0193780 A1 can hardly be termed a thin film ME sensor even for the reason that the thickness of the ferroelectric composite has to correspond at least to the thickness of the ferroelectric fibres that are specified as 100 to 350 µm. It appears, as if the composite plate is cantilevered, and on both sides it is covered by a polymer film that apparently already supports one pair each of interdigital electrodes. The two-sided contacting presumably serves to generate a more homogenous field distribution inside the thick composite plate during the necessary electric poling. The magnetostrictive material that is to be applied onto the polymer film with a layer thickness of about 25 μm must not produce high temperatures there during application or be exposed to these as else the polymer could be damaged. On the whole, the manufacture of the sensor of US 2008/0193780 A1 appears to be problematic or at least complicated and not compatible with the proven methods of mass production.

US 2007/252593 A1, US 2011/077663 A1, JP 11126449 A and US 2008/145693 A1 shall be named as further documents relating to the prior art.

If the idea of ME voltage tapping along the extent of the ferroelectric layer is to be taken up and to be transferred to ME sensors, in particular to thin film ME sensors that can be manufactured using the usual methods of microsystems technology, one is confronted with several problems.

The typical ferroelectric layer of an ME sensor is ceramic and is usually applied onto a substrate in the form of a precursor that also contains organic material (e.g. in the case of sol gel methods or screen printing). This layer is pyrolyzed and crystallized during a heat treatment at temperatures above 500° C. The manufacture of the ferroelectric layer can also take place by cathode sputtering or pulsed laser deposition. In these cases, too, the deposition takes place at elevated temperatures, and a subsequent heat treatment above 500° C. is required for crystallisation.

Replacing the conventional lower electrode by an electrode that is engineered for voltage tapping along the extent of the layer, is not feasible, because it has to be expected that crystallisation of the ferroelectric as a result of the presence of a structured electrode layer (e.g. from noble metal platinum or gold) is disturbed. So that after crystallisation of the ferroelectric, such an electrode can be arranged on the ferroelectric layer, it has to exhibit an exposed outer face.

At first sight this suggests to reverse the sequence of the layer arrangement, i.e. onto the substrate at first the magnetostrictive material is applied and in turn on this the ferroelectric. This can also be termed inverted layer sequence.

However, the magnetostrictive material requires a magnetic anisotropy to exhibit magnetostriction properties in the first place. Magnetic anisotropy can for example be produced if the magnetostrictive material is deposited under controlled conditions in a magnetic field or subsequently heat treated in magnetic field. Another possibility emerges from the—up to now unpublished—EP 11 171 354.1. According to it, the magnetostrictive layer is produced as a multilayer stack system of ferromagnetic—FM—and antiferromagnetic AFM—layers that alternate, in which an exchange bias can form. The adjustable orientation of the AFM layers "pins" the magnetic dipoles of the FM layers such that even in the absence of the bias magnetic field that is otherwise required for setting a suitable operating point, a high piezomagnetic coefficient is produced in the layers along a direction that can be determined. Use of the multilayer stack system according to EP 11 171 354.1 is regarded as very advantageous for manufacturing sensor arrays since the magnetic interaction between the individual sensors is very small and thus they do not interfere with each other.

However, the magnetostrictive layers mentioned above quite clearly rule out to expose these layers to the temperatures that are necessary for crystallising a ceramic ferroelectric since they would be permanently damaged as a result. When multilayers are used, for example diffusion could destroy the layer design or amorphous layers could crystallise at an elevated temperature. Even if the construction of an ME sensor having an inverted layer sequence (see above) is successful, at the latest when the ferroelectric layer having an interdigital electrode or the like is poled, the problem arises that a markedly increased finger distance of the electrodes also requires applying a correspondingly increased voltage for the required electric field strength between $10^6$ and $10^7$ V/m to be achieved. In the case of thin film ME sensors having layer thicknesses in the range of a few micrometers, this is extremely problematic since on the one side of the ferroelectric layer there is arranged at a small distance opposite the electrode arrangement the magnetostrictive material that is usually metallic and thus strongly distorts the electric field. A poling of the ferroelectric that can be reproduced well or is even uniform can hardly be achieved in this way. Rather an electric breakdown of the ferroelectric has to be expected if the voltage is selected to be too large and therefore eventually a circuit can be closed by means of the magnetostrictive layer.

With this background, the object of the invention is to suggest a new type of ME sensor that makes it possible to tap a markedly higher ME voltage than a conventional cantilever-beam sensor and that at the same time can be produced using conventional deposition methods.

The object is achieved by a magnetoelectric sensor comprising a layer stack from a magnetostrictive layer, a ferroelectric layer, and an electrically non-conducting support layer, characterized in that the support layer is thicker than the ferroelectric layer, is arranged between the magnetostrictive and the ferroelectric layers and that further an electrode arrangement, engineered for tapping the signal voltage along the extent of the layer, is arranged on the ferroelectric layer, the finger distance of the electrode arrangement being greater than the thickness of the ferroelectric layer.

The sub claims specify advantageous designs of the ME sensor according to Claim 1 or relate to a manufacturing method.

The basic idea of the invention is therefore to separate spatially the two functional layers of the ME sensor by arranging between both a layer from a dielectric material. The distance of the functional layers therefore is to be larger, preferably many times larger, than the thickness of the ferroelectric layer. The dielectric layer between the functional layers therefore has the purpose both of electrically insulating and also maintaining the distance. Both functional layers of the new ME sensor are outside layers of the layer stack. The term "separator ME sensor" (SMES) is suggested for the new ME sensor design and used below.

The previously held view that a magnetoelectric composite could exhibit good ME sensor properties only if the magnetostrictive and the piezoelectric phases are arranged in very close proximity or even directly one on top of the other, is thus refuted. As experiments have shown, the change in length of the magnetostrictive layer that is to take place along the extent of the layer can be readily transferred even through thick separators onto the ferroelectric layer.

The magnetostrictive layer can be regarded as an emitter of a mechanical shear wave—continuously or pulsed—that propagates through the separator and is absorbed in the ferroelectric layer while forming an electric polarisation. Even though attenuation losses have to be expected in the process, the transported mechanical energy is still sufficient to obtain, in cooperation with the now increased finger distance of the electrode arrangement from the ME voltage tap, a markedly stronger signal for the same magnetic field strength than in the prior art.

As is well known, high mechanical impedance contrasts at layer boundaries represent a disadvantage for transmitting mechanical energy. Therefore the dielectric separator should be at least similar to the functional layers in terms of its mass density and the speed of sound. It preferably exhibits a modulus of elasticity that is not too small. In this respect, practically all polymers are unsuitable as separator material. This also represents an important difference from the teaching of US 2008/0193780 A1 that arranges a thin polymer film between the functional layers to support the IDT and to isolate it electrically. This specification does not give any account as to the efficiency of the mechanical energy transport through this film despite this not appearing obvious. As supports of a ceramic ferroelectric, polymers are unsuitable anyway since they would not survive crystallisation of the layer. The modulus of elasticity of the separator material should preferably be above 20 GPa.

Conveniently, traditional substrates on which the functional layers for ME sensors are deposited are best suited as dielectric separators. These substrates preferably comprise glass, in particular silicon dioxide, a ceramic (e.g. aluminium oxide, $Al_2O_3$), or a semiconductor, for example a silicon wafer. As an example, the modulus of a elasticity of silicon amounts to 107 GPa, that of $SiO_2$ amounts to 94 GPa.

For manufacturing separator ME sensors it is therefore not at all requisite to manufacture a separate separator. Rather a conventional substrate can simply be coated on both flat sides with in each case one of the two functional layers so that the substrate itself represents the separator. Here the thickness of the substrate is already known and in general very much larger than the thickness of one of the functional layers. It normally lies between approximately 50 and 500 µm, preferably between 100 and 200 µm. The thickness of the functional layers is usually one order of magnitude lower.

An electrode arrangement for voltage tapping along the extent of the layers is applied on the flat side, coated with the ferroelectric, preferably lead zirconate titanate (PZT), of the substrate, the finger distance of the arrangement being larger than the thickness of the ferroelectric layer, preferably even larger than the thickness of the separator. The finger distance of the electrodes is thus larger, preferably even larger by at least one order of magnitude, than in the case of the cantilever-beam sensor according to the prior art where the electrodes are only spaced by precisely the ferroelectric layer thickness.

In principle, the finger distance that can be adjusted is limited at the top only by the dimensions of the completed sensor. However, in the case of finger distances in the millimeter range there already arises the necessity of performing the poling of the ferroelectric with kilovolt voltages. This is normally done in an oil bath so that no arcing can occur through air. The magnetostrictive layer that is preferably formed from an amorphous magnetic material and exhibits a metallic conductivity will have been arranged on the second flat side of the substrate even before poling since setting up its magnetic anisotropy requires temperature treatment in the magnetic field ("field annealing") typically in the range 250-350° C. Electric poling in turn requires temperatures below the Curie temperature of the ferroelectric so that it has to represent the last step in the thermal sequence during sensor manufacture. During poling, already one conductor is situated on the other side of the substrate—the separator—which leads to the field collapsing there. As a result, part of the poling voltage also drops across the dielectric separator, and this part may not lead to an electric breakdown. Fortunately, the breakdown field strengths for conventional substrates are very high, for example amounting to about 30 MV/m for silicon and up to 1 GV/m for $SiO_2$.

Separator ME sensors can be manufactured without problems that exhibit on the ferroelectric layer an electrode arrangement designed for signal-voltage tapping having finger distances in the range of a few millimeters if the dielectric separator situated between the functional layers exhibits a thickness of 100 µm or more.

The invention is described below in more detail with reference to the attached drawings and an exemplary embodiment.

Figure 1:
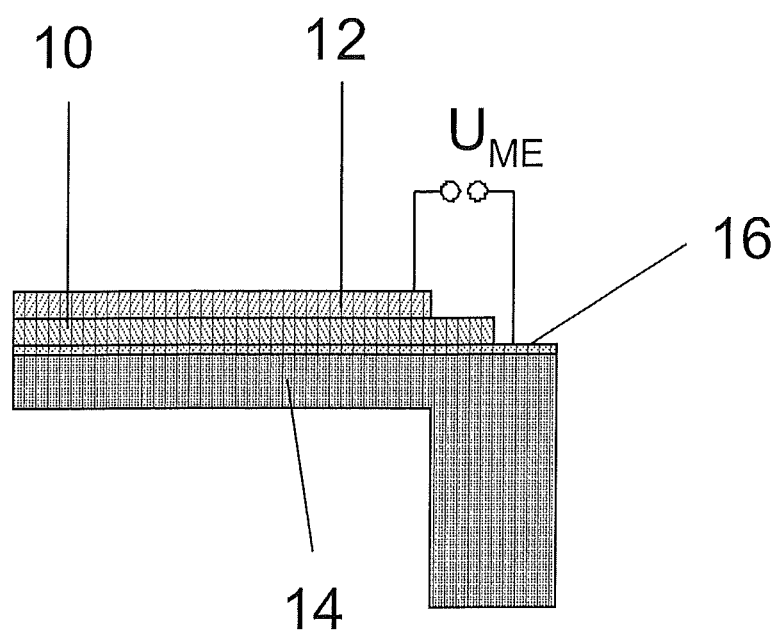
FIG. 1 shows a schematic illustration of a magnetoelectric cantilever-beam sensor in a plate-capacitor design according to the prior art.
Figure 2:
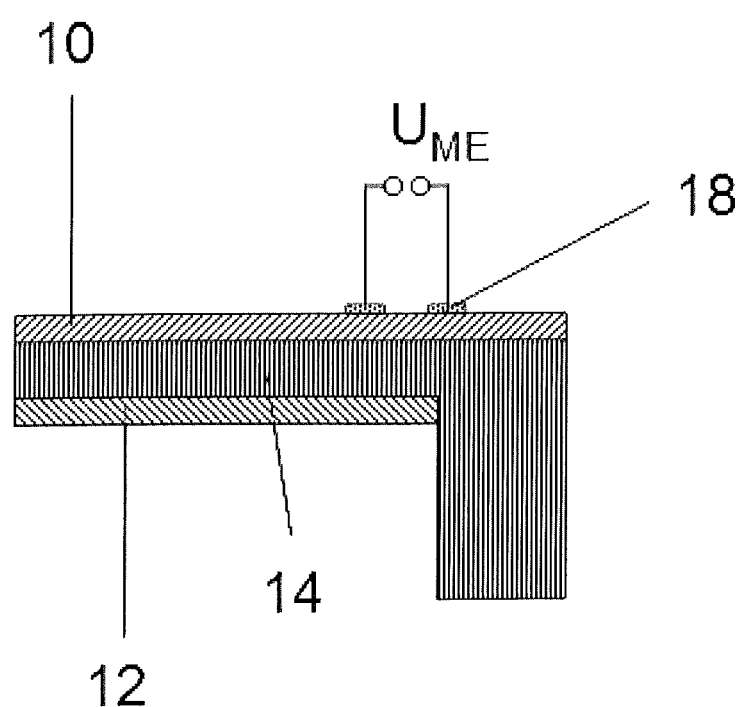
FIG. 2 shows a schematic illustration of a magnetoelectric cantilever-beam sensor as separator ME sensor.

FIG. 1 shows the schematic illustration of a cantilever-beam sensor according to the prior art that had already been described above. For comparison, FIG. 2 shows a sketch of the separator ME sensor. The ferroelectric layer (10) and the magnetostrictive layer (12) are here situated on opposite flat sides of the same substrate (14). The substrate material forms the separator (14) that in FIG. 2 is not shown true to scale. The separator (14) is in fact thicker than each of the functional layers (10, 12) typically by one order of magnitude. The electrode arrangement (18) for tapping the ME voltage is only arranged on one outer face—on the upper side of the ferroelectric layer (10)—and measures electric voltages that are produced alongside the extent of the layers. These voltages are generated in the ferroelectric (10) when a change in length is caused in the magnetostrictive layer (12) by a magnetic field acting along the layer, the change in length then being transferred onto the separator (14) and onto the ferroelectric layer (12).

A method for manufacturing a separator ME sensor can be carried out using the following steps:

1. applying a material forming a ferroelectric layer (10), e.g. spin-coating a sol gel precursor or cathode sputtering a ferroelectric on the first flat side of a dielectric substrate (14)
2. crystallisation of the material at temperatures above 500° C. while forming a ferroelectric layer (10) whose thickness is smaller than the known thickness of the substrate (14),
3. applying an electrode arrangement (18), e.g. by sputtering platinum using lithographic masking, engineered for tapping the signal voltage along the extent of the layer, on the ferroelectric layer (10), the finger distance being greater than the thickness of the ferroelectric layer (10),
4. applying a magnetostrictive layer (12) on the second flat side of the substrate (14),
5. magnetic poling of the magnetostrictive layer (12) at temperatures below 500° C. ("field annealing"), and
6. alternating electric poling of the ferroelectric layer (10) along the extent of the layer at a temperature below the Curie temperature of the ferroelectric layer (10).

The alternating electric poling is intended to mean that at the end of the poling process between in each case two neighbouring electrode fingers of differing polarity, polarisation vectors have been generated in the ferroelectric layer plane that point in alternating fashion in opposite (alternating) directions (cf. "push-pull units" US 2008/0193780 A1).

The method described above exhibits three heat treatments in the steps 2, 5 and 6. Here it is important that the respective maximum temperatures are passed through in a descending sequence. It is also possible to carry out steps 4 and 5 simultaneously, which is known to the person skilled in the art.

A separator ME sensor can be manufactured as an exemplary embodiment as follows:

As the substrate, for example a silicon wafer (525 µm thick) having a thermally oxidised silicon oxide layer is used. Onto the oxide layer, at first a zirconium dioxide layer as diffusion barrier and seed-starting layer and following this a PZT layer are applied in each case by means of the sol gel method. Onto the PZT layer (thickness 1-2 µm) crystallised at about 700° C., a pair of conventional interdigital electrodes (e.g. here with a finger distance 5-20 µm) supplied by means of photolithography and subsequent cathode sputtering of gold. Then the substrate is thinned mechanically to a residual thickness of about 150-200 µm by grinding and polishing the substrate backside. The magnetostrictive layer Metglas® (FeCoSiB) (thickness about 4 µm) is applied on this polished, very smooth backside by cathode sputtering. The beams are finally diced by sawing.

In comparison, a conventional cantilever-beam sensor (as in FIG. 1) having the plate-capacitor design is further manufactured from the same materials. In both cases after application, the magnetostrictive layers are magnetically poled at temperatures significantly below 500° C., typically in the temperature range between 250° C. and 350° C., for setting up a magnetic anisotropy.

Prior to the beams being usable as magnetoelectric sensors, the ferroelectric PZT layer has to be poled electrically. The layer composite is heated to about 140° C. in the process and then in both cases an electric field of 10 MV/m (e.g. having a voltage of 200 V at 20 µm finger distance for the separator ME sensor or having about 25 V at 2.5 µm PZT-layer thickness for the cantilever-beam sensor in the plate-capacitor design) is applied. After 15 minutes of constant temperature, cooling to room temperature takes place. Here, too, the electric field remains applied. After the poling step, the sensors can be used.

Figure 3:
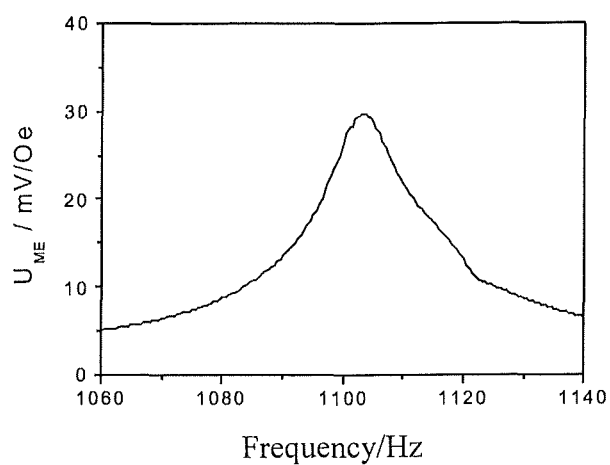
FIG. 3 shows measurement curves for the ME voltage of the cantilever beam in the resonant case for the separator ME sensor (FIG. 2, $f_R \approx 1100$ Hz) and the sensor according to the prior art (FIG. 1, $f_R \approx 2390$ Hz).
Figure 3:
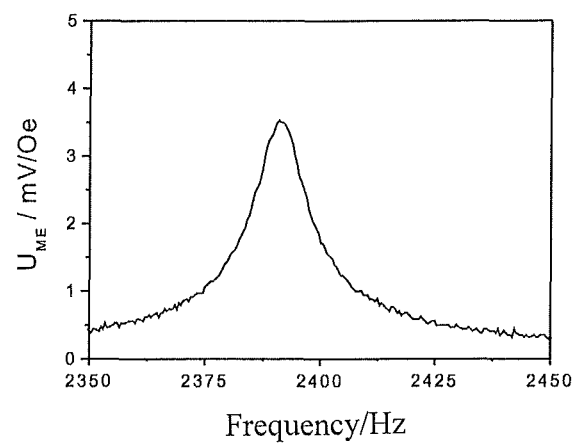

FIG. 3 shows the magnetoelectric voltage output of the sensors when a magnetic field to be measured having an amplitude 1 Oe and a frequency in the range of the mechanical resonant frequencies of the cantilever beams—that differ here in terms of construction—is applied. The ME signal of the separator ME sensor (upper graph) is larger by about the factor 5-6 than the ME voltage signal of the conventional cantilever-beam sensor in the plate-capacitor design (lower graph).

Among the advantages of the inventive sensor design are:
1. Precisely as in the case of the conventional manufacturing method for cantilever-beam sensors according to FIG. 1 it is possible to apply the magnetostrictive layer on the substrate only after the ferroelectric layer has crystallised. The disadvantages mentioned of an inverted layer sequence do not arise.
2. The ferroelectric layer exhibits an outer face onto which any electrode arrangement can be applied that enables voltage tapping along the layer. In the most simplest case this can be a pair of interdigital electrodes—IDT—, but also two mutually contacting IDTs having a meander-shaped counter electrode extending between their fingers are possible. In any case, the design can be selected very freely.
3. Since the finger distance of the electrodes can be set arbitrarily, the sensor production now has a degree of freedom that can be selected over a range of several orders of magnitude depending on the requirements and possibilities of the user. In the prior art, the electrode distance was limited by the process effort of setting the layer thickness.
4. The magnetostrictive layer can be formed as a multilayer stack system. Thin layers—a few nanometers thick—from anti-ferromagnetic (AFM) and ferromagnetic (FM) material that alternate can preferably be applied using a sputtering method that according to the EP 2 538 235 B1 form an exchange bias in the case of suitable "field annealing" which obviates provision of a permanent-magnetic bias magnetic field. However, AFM/FM layer systems should to be applied on substrates, e.g. silicon wafer, that are as smooth and free from texture as possible. It is at least more difficult to provide them on rough and irregularly textured, ceramic ferroelectrics, e.g. with the aid of texture-extinguishing interlayers. If coating of both flat sides of the same substrate is carried out when manufacturing separator ME sensors, arranging precise multilayer stack systems does not pose any problem.

At this juncture it should be mentioned that the approach of coating both sides of the substrate with the functional layers of an ME sensor could of course also be used for the conventional cantilever-beam design. For this purpose, at first a two-dimensional lower electrode and a ferroelectric would be applied onto the substrate front, then on top of this a two-dimensional upper electrode, and finally the magnetostrictive layer onto the substrate backside. Compared to the prior art, this design would exhibit the advantage described at item 4 above, and of course item 1 would also apply. However, an increased ME voltage could only be expected if in this way a magnetostrictive layer system having a higher piezomagnetic coefficient than previously possible can be used. For the rest, one would want to provide here generally the thinnest possible separator between functional layers, since when poling the ferroelectric there can be no voltage drop anyway across the separator. Here the separator has a completely different task, i.e. providing a favourably structured surface. In this respect this "almost conventional" sensor design is not subordinate to the previously described concept of the inventive separator ME sensor that among others is characterized by a voltage tap along the extent of the layer, and is also not claimed here.

Finally it shall be remarked that in the present description the terms "support layer", "separator" and "substrate" are all used to designate the same material in an ME sensor and to that extent are meant to be synonyms. The reasons that three terms are used here for a technical article are listed below:
a) The teen "separator" best describes the inventive idea, but the person skilled in the art of ME sensors is not acquainted with it. Therefore it will not be used in the claims.
b) Although a dielectric "substrate" will be present in each thin film ME sensor, a separator ME sensor does not necessarily have to be manufactured using thin film technology. For example also a cantilevered pre-manufactured ferroelectric ceramic plate could be used as substrate. As poling of this plate alongside its extent cannot be carried out—as has already been explained—until the magnetostrictive layer has been arranged and pre-treated, here, too, a separator will be necessary if high voltages are used for poling. Therefore the separator could be applied onto the ferroelectric plate using any appropriate coating method, the magnetostrictive layer then being arranged on the separator. The dielectric separator therefore does not necessarily have to be the substrate, but can also be applied for this purpose.

c) If any functional thin film ME sensor that has already been diced is examined—and e.g. cut open in the process —, usually two very thin functional layers and a dielectric layer that stabilises mechanically and supports the two functional layers will be found. Independent of the question whether this supporting layer at one time was the substrate or was itself applied as a layer, the person skilled in the art will be able to accept the term "support layer" for this.

LIST OF REFERENCE SYMBOLS 10 ferroelectric layer
12 magnetostrictive layer
14 support layer
16 lower electrode
18 electrode arrangement
ME magnetoelectric sensor
$U_{ME}$ voltage

The invention claimed is:

1. A magnetoelectric (ME) sensor comprising a layer stack from a magnetostrictive layer (12), a ferroelectric layer (10), and a dielectric support layer (14), wherein a. the dielectric support layer (14) is thicker than the ferroelectric layer (10); the dielectric support layer (14) is arranged between the magnetostrictive layer (12) and the ferroelectric layer (10); b. an electrode arrangement (18) comprising finger electrodes having, a finger distance, configured for tapping a signal voltage along the longitudinal extent of the ferroelectric layer, is arranged on the ferroelectric layer (10), and c. the finger distance of the electrode arrangement (18) is greater than the thickness of the ferroelectric layer (10), the ferroelectric layer (10) is completely overlaid on the support layer (14).

2. The ME-sensor according to claim 1, wherein the finger distance of the electrode arrangement (18) is greater than the thickness of the support layer (14).

3. The ME sensor according to claim 1, wherein the dielectric support layer (14) is formed from a material that exhibits a modulus of elasticity of more than 20 GPa.

4. The ME-sensor according to claim 1, wherein the dielectric support layer (14) is formed from a glass, a ceramic or a semiconductor.

5. The ME-sensor according to claim 1, wherein the ferroelectric layer (10) is formed from a lead zirconate titanate (PZT).

6. The ME sensor according to claim 1, wherein the magnetostrictive layer (12) is formed from the group of the amorphous magnetic materials.

7. The ME-sensor according to claim 4, wherein the glass is silicon dioxide.

8. The ME-sensor according to claim 4, wherein the support layer (14) is formed from silicon.

* * * * *